United States Patent
Chen et al.

(10) Patent No.: US 9,668,577 B2
(45) Date of Patent: Jun. 6, 2017

(54) SLIDE RAIL MOUNTING MECHANISM (71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 14/949,894

(22) Filed: Nov. 24, 2015

(65) Prior Publication Data

US 2017/0007019 A1    Jan. 12, 2017

(30) Foreign Application Priority Data

Jul. 9, 2015   (TW) .............................. 104122496 A (51) Int. Cl.
   *A47B 88/00*   (2017.01)
   *A47B 96/06*   (2006.01)
   *H05K 7/14*    (2006.01)
   *A47B 96/07*   (2006.01)
   *H05K 7/18*    (2006.01)
   *A47B 88/427*  (2017.01)

(52) U.S. Cl.
   CPC .......... *A47B 96/067* (2013.01); *A47B 88/427* (2017.01); *A47B 96/07* (2013.01); *H05K 7/1489* (2013.01); *H05K 7/183* (2013.01); *A47B 2088/4274* (2017.01)

(58) Field of Classification Search
   CPC .............. H05K 7/1489; A47B 88/0418; A47B 2088/0422; A47B 2088/0429; A47B 2088/0425; A47B 2088/0437
   USPC ............ 312/334.7, 330.1, 334.4, 333, 319.1, 312/223.1, 265.1–265.4; 361/725–727; 384/21, 22
   See application file for complete search history.

(56) References Cited

U.S. PATENT DOCUMENTS 3,624,703 A * 11/1971 Pavek ...................... F25C 5/14
                                                             248/239
6,209,979 B1   4/2001 Fall
6,938,967 B2   9/2005 Dubon
(Continued)

FOREIGN PATENT DOCUMENTS

JP   3180814   *  1/2013
JP   3197863 U    6/2015

*Primary Examiner* — Janet M Wilkens
(74) *Attorney, Agent, or Firm* — Winston Hsu (57) ABSTRACT

A slide rail mounting mechanism includes a rail element and an adjustment element. The rail element has an upper wall, a lower wall and a middle wall connected between the upper wall and the lower wall. A receiving slot is formed between the upper wall and the middle wall. The adjustment element is movably mounted to the rail element. The adjustment element has an upper part located adjacent to the upper wall of the rail element, and a lower part located adjacent to the lower wall of the rail element; wherein when the adjustment element is adjusted to move to a position, the adjustment element extends to be in the receiving slot.

8 Claims, 7 Drawing Sheets

(56) References Cited

U.S. PATENT DOCUMENTS

| | | | |
|---|---|---|---|
| 7,967,399 B1* | 6/2011 | Baiza | A47B 88/0422 312/223.1 |
| 8,366,217 B1* | 2/2013 | Chen | A47B 88/044 312/333 |
| 8,403,433 B2* | 3/2013 | Chen | A47B 88/044 312/333 |
| 8,925,883 B2* | 1/2015 | Fan | H05K 7/1489 248/222.13 |
| 2004/0108797 A1* | 6/2004 | Chen | A47B 88/044 312/334.7 |
| 2007/0018547 A1* | 1/2007 | Yang | H05K 7/1489 312/333 |
| 2007/0114895 A1* | 5/2007 | Chen | A47B 88/0422 312/333 |
| 2013/0016461 A1* | 1/2013 | Fan | H05K 7/1489 361/679.01 |
| 2013/0044416 A1 | 2/2013 | Fan | |
| 2016/0262539 A1 | 9/2016 | Chen | |

* cited by examiner

SLIDE RAIL MOUNTING MECHANISM

BACKGROUND OF THE INVENTION

1. Field of the Invention

The present invention relates to a slide rail mounting mechanism, and more particularly, to a slide rail mounting mechanism applicable to carried objects with different lengths.

2. Description of the Prior Art

Generally, a slide rail assembly at least comprises a first rail and a second rail. Wherein, the second rail can be moved to be at a retrieve position or an extension position relative to the first rail. The second rail is configured to mount a carried object, such as a chassis, drawer or the like.

U.S. Pat. No. 6,209,979 B1 discloses a slide rail assembly. As shown in FIG. 1 of U.S. Pat. No. 6,209,979 B1, a rail element of the slide rail assembly has a plurality of L-shaped slots 16 for mounting a plurality of corresponding mounting posts 14 of a chassis. Generally, when mounting the chassis by the above arrangement, the chassis must be lifted up to be right above the rail element, the mounting posts of the chassis are then aligned to all the L-shaped slots for mounting in a vertical drop-in manner, and the chassis is further moved horizontally. As such, the chassis can be mounted on the rail element without tools. However, such mounting method must align all of the mounting posts to all of the L-shaped slots. The slide rail assemble is applicable to the chassis with different lengths (for example, a longer chassis can has three mounting posts for mounting on the rail element, and a shorter chassis can has two mounting posts for mounting on the rail element), but it is not convenient to mount the chassis in the vertical drop-in manner.

U.S. Pat. No. 6,938,967 B2 discloses another slide rail assembly. As shown in FIG. 9 of U.S. Pat. No. 6,938,967 B2, a rail element of the slide rail assembly has a plurality of receiving slots 16 substantially in a U shape, for mounting a plurality of corresponding mounting posts 14 of a chassis. Generally, when mounting the chassis by the above arrangement, the chassis must be lifted up to be right above the rail element, and the mounting posts are then aligned to the receiving slots for mounting in a vertical drop-in manner. Since the receiving slots on the rail element are U-shaped slots, when a front end of the chassis is pressed by an external force, a rear end of the chassis may be tilted up. Therefore, when using the U-shaped receiving slot, an elastic engagement element is usually provided for one of the receiving slots. Through holding the mounting post of the chassis by the engagement element for preventing detachment of the mounting post from the receiving slot, stability of mounting the chassis to the rail element can be improved. However, when the chassis is going to be detached from the rail element, the user must apply a force to keep the engagement element outside the receiving slot, such that the chassis can be detached from the rail element. The above release operation is inconvenient. On the other hand, such design is mainly applicable to a chassis with a certain specification. When mounting a shorter chassis, since the receiving slot at a rear end of the rail element is in a U shape without any blocking feature, the rear end of the chassis may be tilted up when the front end of the chassis is pressed by an external force.

Therefore, the present invention is provided for solving the problems.

SUMMARY OF THE INVENTION

The present invention relates to a slide rail mounting mechanism applicable to carried objects with different lengths.

According to an embodiment of the present invention, a slide rail mounting mechanism comprises a rail element, an adjustment element, and a fixing element. The rail element comprises a first receiving slot and a second receiving slot. The adjustment element is movably mounted to the rail element and capable of moving relative to the rail element between a first position and a second position. One of the adjustment element and the rail element has an elongated hole. The fixing element passes through the elongated hole for connecting the rail element and the adjustment element. Wherein, when the adjustment element is located at the first position, the adjustment element does not extend to be in the first receiving slot; and when the adjustment element is adjusted to move from the first position and the second position, the adjustment extends to part of space in the first receiving slot.

According to another embodiment of the present invention, a slide rail mounting mechanism comprises a rail element and an adjustment element. The rail element has an upper wall, a lower wall and a middle wall connected between the upper wall and the lower wall. A first receiving slot and a second receiving slot are formed between the upper wall and the middle wall. The first receiving slot comprises a first part and a second part communicated with each other. The adjustment element is movably mounted to the rail element. The adjustment element has an upper part located adjacent to the upper wall of the rail element and a lower part located adjacent to the lower wall of the rail element. Wherein, when the adjustment element is adjusted to move to a position, the adjustment element extends to be in the first receiving slot between the first part and the second part.

According to another embodiment of the present invention, a slide rail mounting mechanism is applicable to a carried object. The carried object comprises a first mounting element and a second mounting element. The slide rail mounting mechanism comprises a rail element and an adjustment element. The rail element comprises a first receiving slot and a second receiving slot separated from each other. The first receiving slot is configured to mount the first mounting element and has a first part and a second part communicated with each other. The second receiving slot is configured to mount the second mounting element. The adjustment element is movably mounted to the rail element. Wherein, when the adjustment element moves relative to the rail element to a position, the adjustment element extends to be in the first receiving slot between the first part and the second part. Wherein, when the first mounting element of the carried object enters the second part from the first part of the first receiving slot of the rail element and the second mounting element is located in the second receiving slot, the adjustment element, which is located at the position, is configured to block the first mounting element from being directly detached from the first receiving slot in a vertical manner.

According to one of the above embodiments, the rail element has an upper wall, a lower wall, and a middle wall connected between the upper wall and the lower wall. A passage is defined by the upper wall, the lower wall and the middle wall. The adjustment element is located in the passage. Each of the receiving slots extends from a portion of the upper wall of the rail element to a portion of the middle wall of the rail element. The adjustment element has an upper part located adjacent to the upper wall of the rail element, a lower part located adjacent to the lower wall of the rail element, a main body part connected between the upper part and the lower part, and a blocking part extended from the main body part. The first receiving slot comprises a first part and a second part communicated with each other. When the adjustment element is located at the first position, the blocking part of the adjustment element does not extend to be in the first receiving slot between the first part and the second part. When the adjustment element is adjusted to move from the first position to the second position, the blocking part of the adjustment element extends to be in the first receiving slot between the first part and the second part.

According to one of the above embodiments, the first receiving slot is substantially in a U shape.

According to one of the above perspectives, the second receiving slot is substantially in a J shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
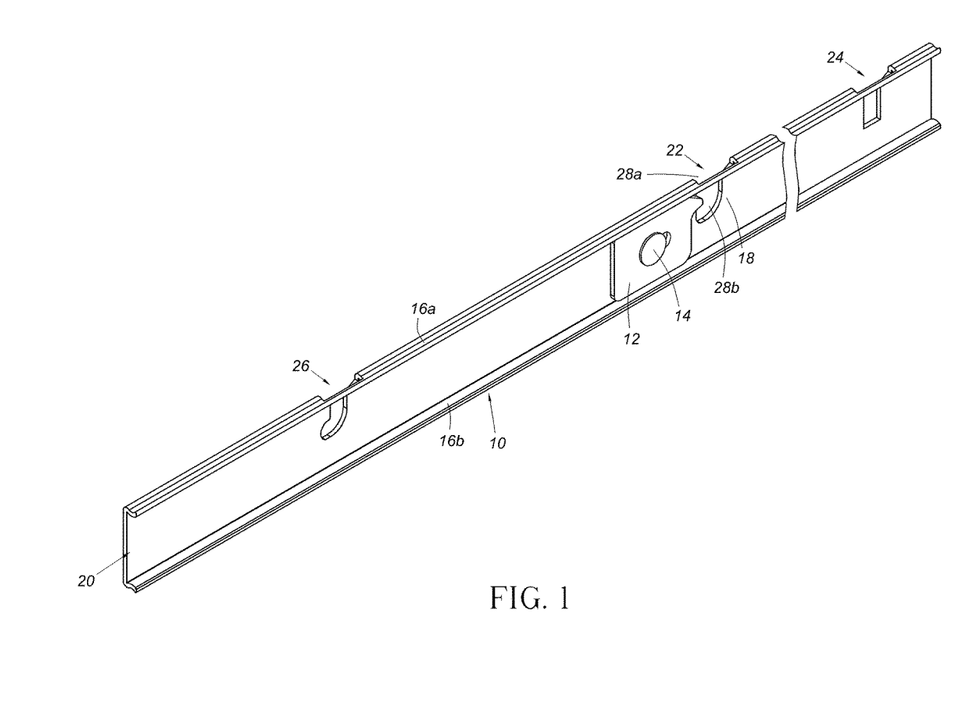
FIG. 1 is a diagram showing a slide rail mounting mechanism according to an embodiment of the present invention.

As shown in FIG. 1, a slide rail mounting mechanism of an embodiment of the present invention comprises a rail element 10, an adjustment element 12 movably mounted to the rail element 10, and a fixing element 14 configured to connect the rail element 10 and the adjustment element 12.

The rail element 10 has an upper wall 16a, a lower wall 16b, and a middle wall 18 extended and connected between the upper wall 16a and the lower wall 16b. A passage 20 is defined by the upper wall 16a, the lower wall 16b and the middle wall 18. In addition, the rail element 10 further has a plurality of slots, such as a first receiving slot 22, a second receiving slot 24 and a third receiving slot 26 in the present embodiment. The first receiving slot 22, the second receiving slot 24 and the third receiving slot 26 are separated from each other. The first receiving slot 22 is located between the second receiving slot 24 and the third receiving slot 26. The first receiving slot 22 and the second receiving slot 24 are substantially in a U shape or V shape. Specifically, the first receiving slot 22 is extended from a first portion of the upper wall 16a of the rail element 10 to a first portion of the middle wall 18 of the rail element 10, and the second receiving slot 24 is extended from a second portion of the upper wall 16a of the rail element 10 to a second portion of the middle wall 18 of the rail element 10. On the other hand, the third receiving slot 26 is substantially in an L shape or J shape different from the shapes of the first receiving slot 22 and the second receiving slot 24. Specifically, the third receiving slot 26 is extended from a third portion of the upper wall 16a of the rail element 10 to a third portion of the middle wall 18 of the rail element 10. In short, the first receiving slot 22, the second receiving slot 24, and the third receiving slot 26 are formed between the upper wall 16a and the middle wall 18 of the rail element 10. Wherein, the first receiving slot 22 has a first part 28a and a second part 28b communicated with each other.

Figure 2:
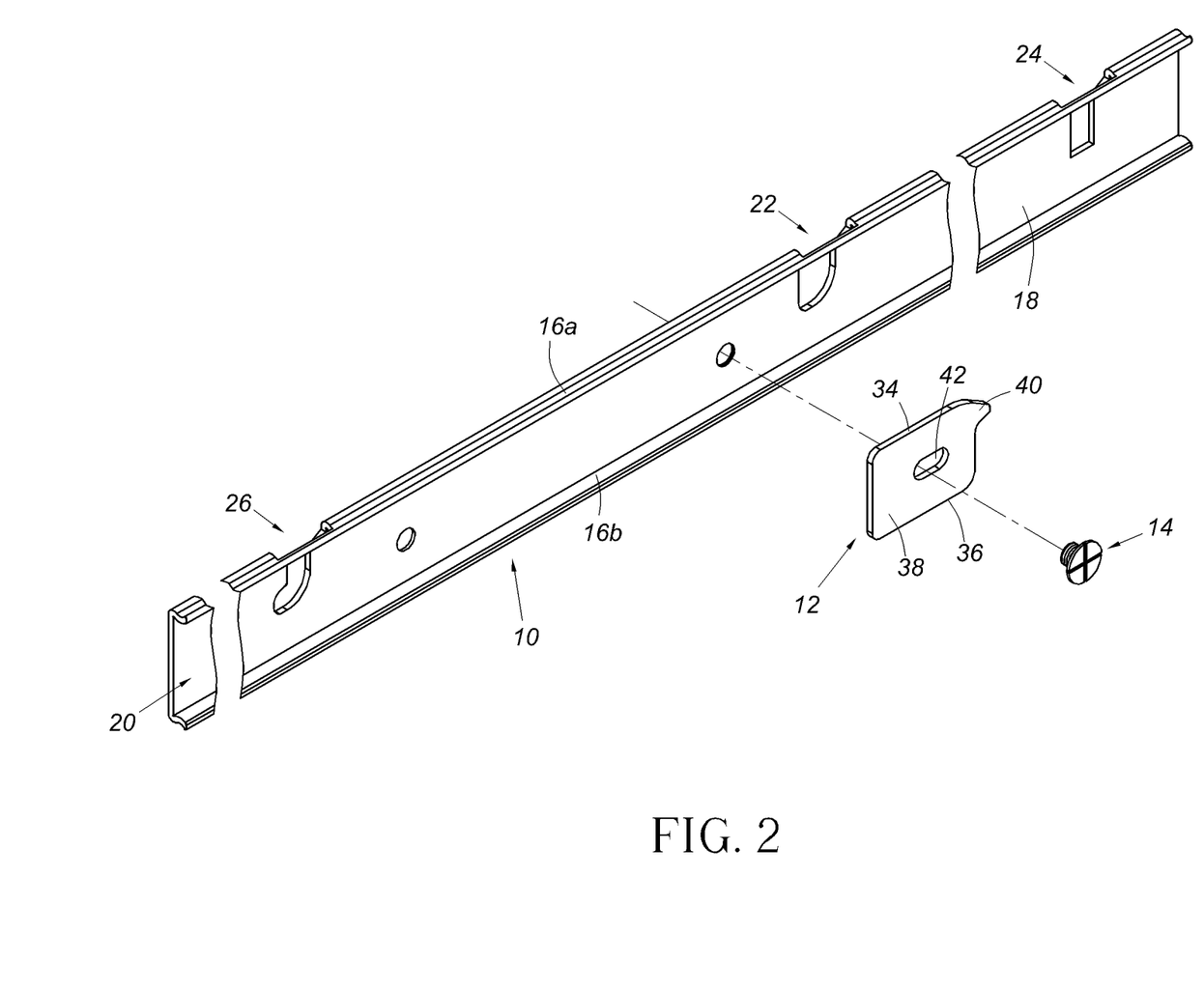
FIG. 2 is an exploded view of the slide rail mounting mechanism according to an embodiment of the present invention.
Figure 3A:
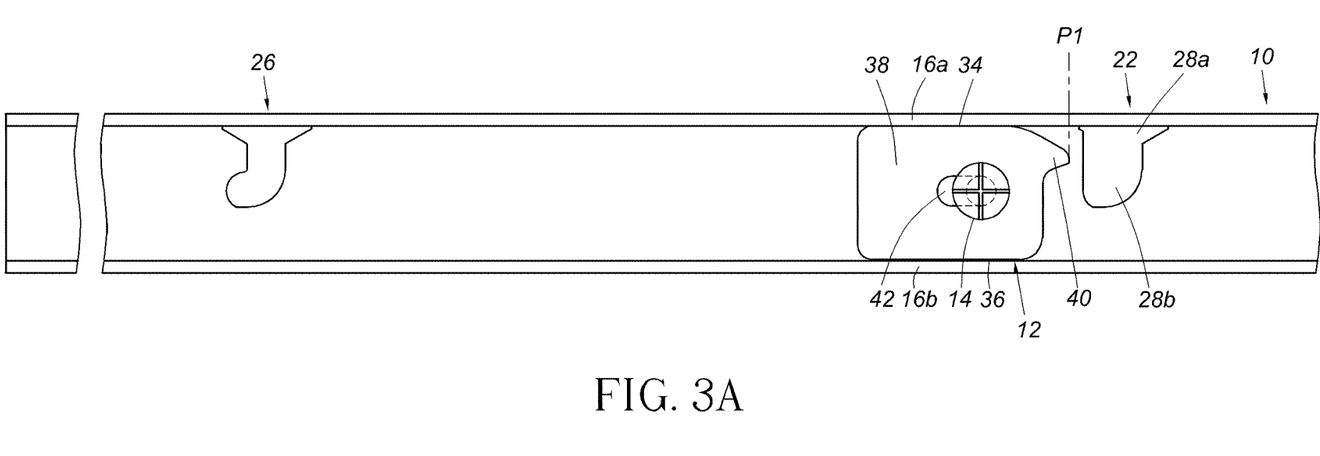
FIG. 3A is a diagram showing an adjustment element of the slide rail mounting mechanism located at a first position relative to a rail element according to an embodiment of the present invention.

FIG. 2 and FIG. 3A further illustrate arrangement relationship between the adjustment element 12 and the rail element 10. In the present embodiment, the adjustment element 12 is movably mounted to the middle wall 18 of the rail element 10, and is located in the passage 20 of the rail element 10. The adjustment element 12 has an upper part 34, a lower part 36, a main body part 38 and a blocking part 40. The upper part 34 is located adjacent to and/or contacts the upper wall 16a of the rail element 10. The lower part 36 is located adjacent to and/or contacts the lower wall 16b of the rail element 10. The main body part 38 is extended and connected between the upper part 34 and the lower part 36. The blocking part 40 is extended from the main body part 38 to be correspondingly adjacent to the first receiving slot 22. The blocking part 40 can be directly or indirectly connected to the main body part 38. Wherein, one of the adjustment element 12 and the rail element 10 has an elongated hole 42. In the present embodiment, the adjustment element 12 has the elongated hole 42 for example. The fixing element 14 passes through the elongated hole 42 for connecting the rail element 10 and the adjustment element 12.

Figure 3B:
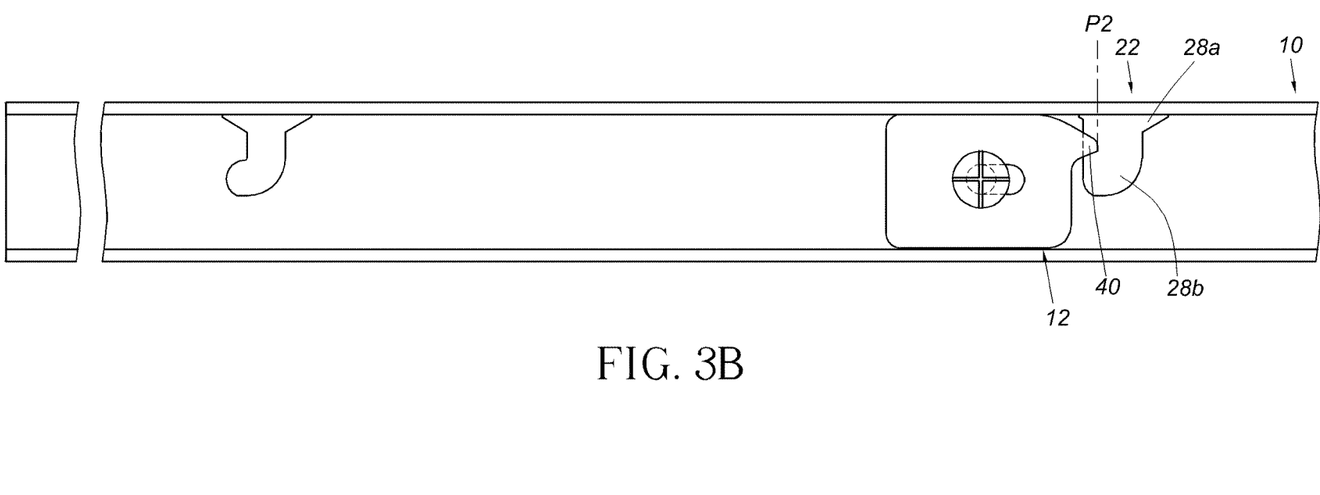
FIG. 3B is a diagram showing the adjustment element of the slide rail mounting mechanism located at a second position relative to the rail element and a portion of the adjustment element extended to be in a receiving slot according to an embodiment of the present invention.

As shown in FIG. 3A and FIG. 3B, the adjustment element 12 is capable of moving relative to the rail element 10 between a first position P1 and a second position P2. Specifically, when the adjustment element 12 is located at the first position P1, a part of the adjustment element 12, such as the blocking part 40, does not extend to be in the first receiving slot 22 between the first part 28a and the second part 28b. When the adjustment element 12 is adjusted to move from the first position P1 to the second position P2, the blocking part 40 extends to be in the first receiving slot 22 between the first part 28a and the second part 28b and occupies part of space in the first receiving slot 22.

Figure 4:
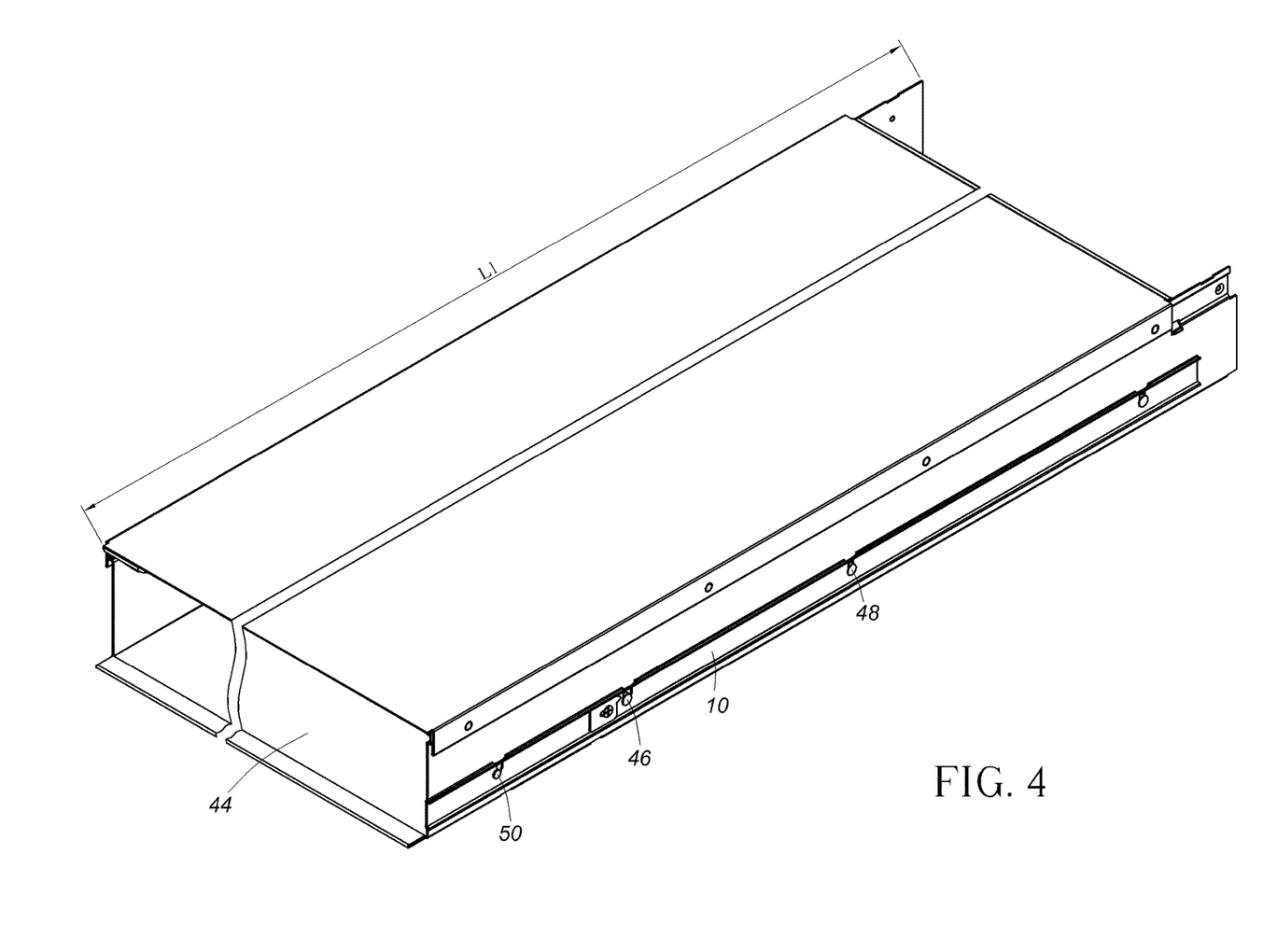
FIG. 4 is a diagram showing the slide rail mounting mechanism applicable to a carried object with a first length according to an embodiment of the present invention.

As shown in FIG. 4, the slide rail mounting mechanism is applicable to a carried object 44. The carried object 44 (such as a chassis of an electronic apparatus, a drawer, or the like) has a first length L1 and comprises a plurality of mounting elements, such as a first mounting element 46, a second mounting element 48, and a third mounting element 50 for illustration in the present embodiment.

Figure 5A:
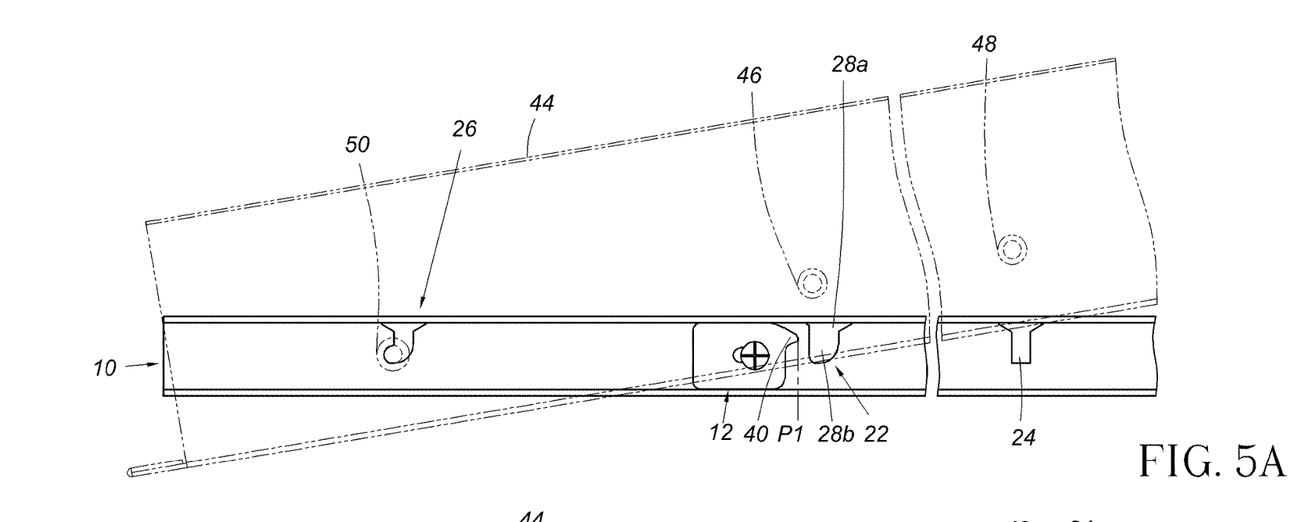
FIG. 5A is a diagram showing a mounting operation between the slide rail mounting mechanism and the carried object for mounting a mounting element of the carried object in a receiving slot of the rail element according to an embodiment of the present invention.
Figure 5B:
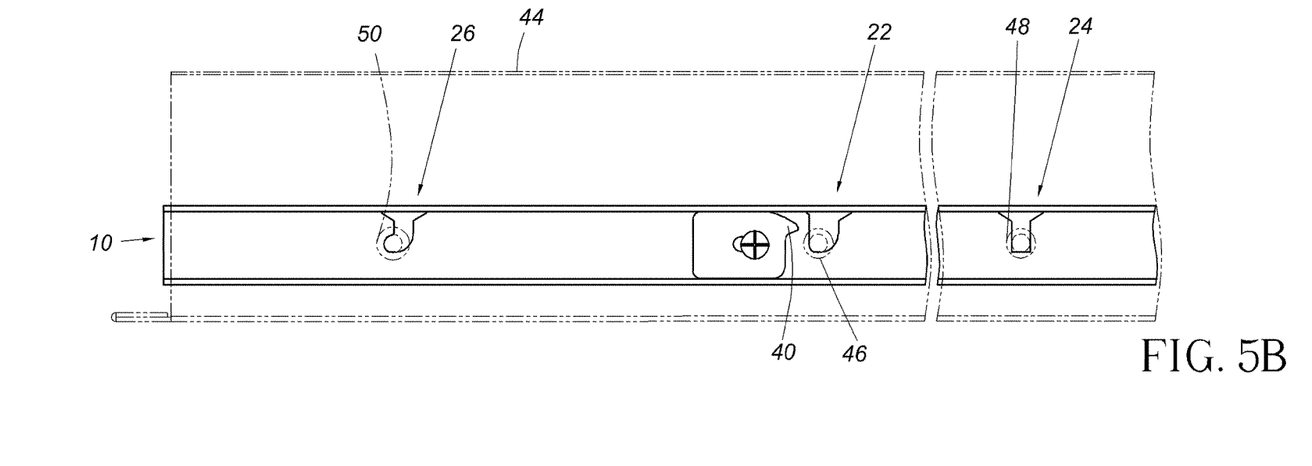
FIG. 5B is a diagram showing a mounting operation between the slide rail mechanism and the carried object for correspondingly mounting all mounting elements of the carried object in the receiving slots of the rail element according to an embodiment of the present invention.

As shown in FIG. 5A and FIG. 5B, the first receiving slot 22, the second receiving slot 24 and the third receiving slot 26 of the rail element 10 are respectively configured to mount the first mounting element 46, the second mounting element 48 and the third mounting element 50 of the carried object 44. Specifically, when the carried object 44 is going to be mounted to the rail element 10, a user can place the third mounting element 50 of the carried object 44 into the third receiving slot 26 obliquely. Since the third receiving slot 26 is substantially in an L shape or J shape, the third mounting element 50 can be blocked in the third receiving slot 26 after the third mounting element 50 enters the third receiving slot 26. On the other hand, since the adjustment element 12 can be adjusted to be located at the first position P1, the blocking part 40 of the adjustment element 12 does not extend to be in the first receiving slot 22 between the first part 28a and the second part 28b, such that the first mounting element 46 and the second mounting element 48 of the carried object 44 can be respectively mounted in the first receiving slot 22 and the second receiving slot 24. Particularly, if the carried object 44 is going to be detached from the rail element 10, the user only needs to apply a force to a position on the carried object 44 near the second mounting element 48 to lift up the carried object 44, such that the third mounting element 50 can be accordingly detached from the third receiving slot 26 of the rail element 10, so as to release the carried object 44 from the rail element 10.

Figure 6:
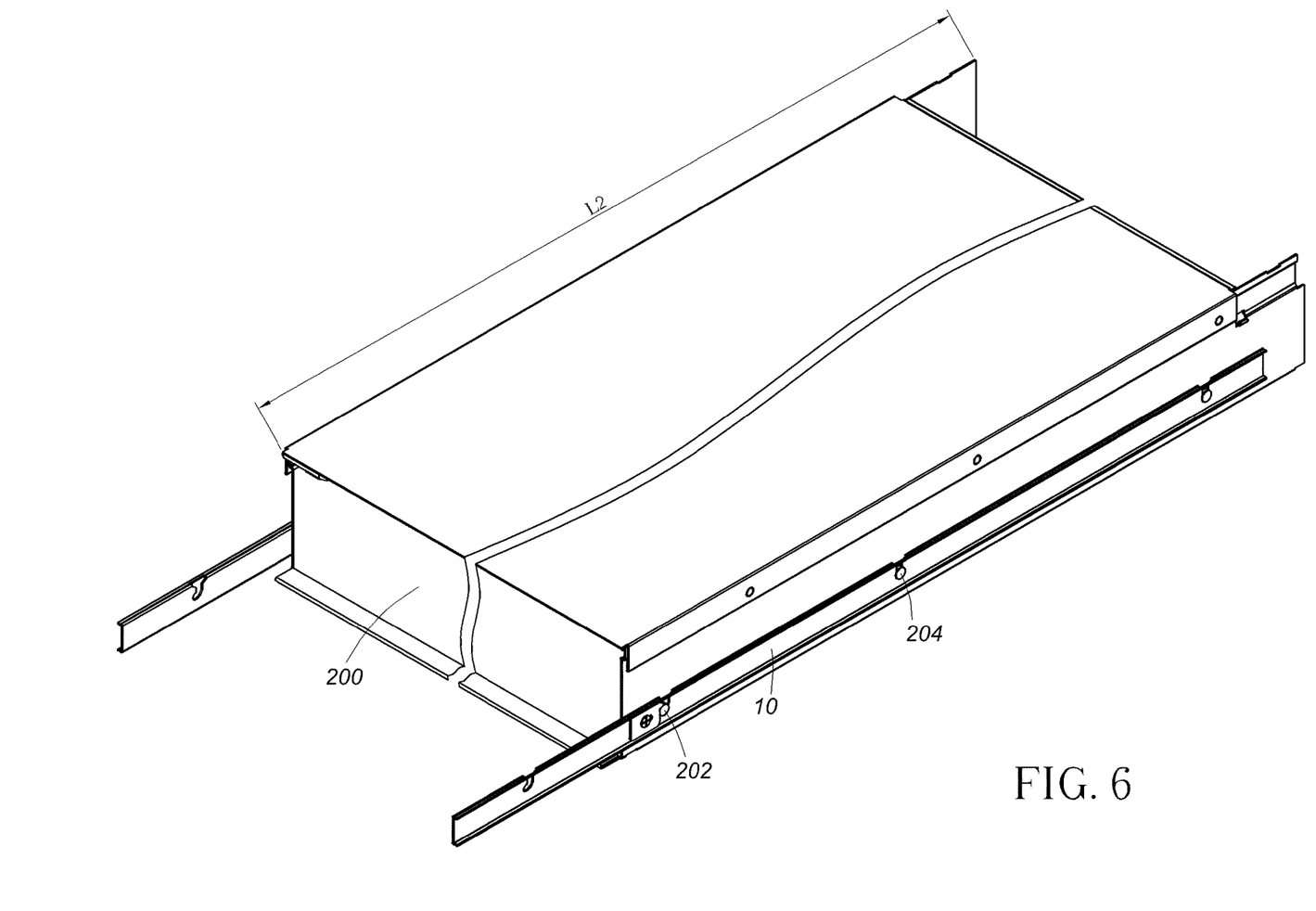
FIG. 6 is a diagram showing the slide rail mounting mechanism applicable to a carried object with a second length according to an embodiment of the present invention.

As shown in FIG. 6, the slide rail mounting mechanism is applicable to a carried object 200. The carried object 200 has a second length L2 (the second length L2 is different from the first length L1 of the carried object 44 in FIG. 4, for example, the second length L2 is shorter than the first length L1). The carried object 200 comprises a first mounting element 202 and a second mounting element 204 capable of being mounted on the rail element 10.

Figure 7A:
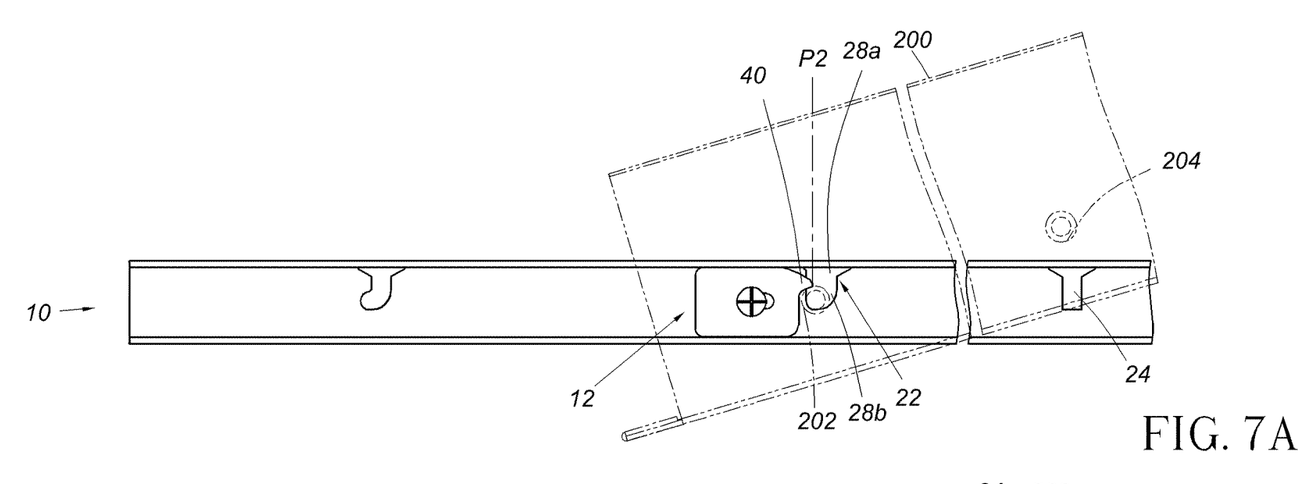
FIG. 7A is a diagram showing a mounting operation between the slide rail mounting mechanism and the carried object for mounting a mounting element of the carried object in a receiving slot of the rail element where the adjustment element being located at a second location for blocking the mounting element according to an embodiment of the present invention.
Figure 7B:
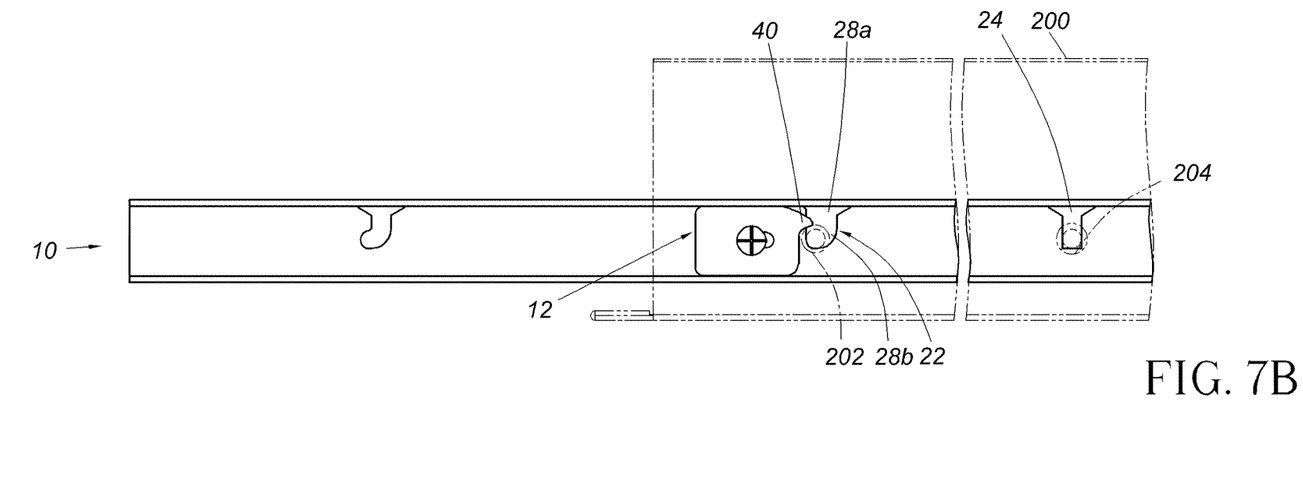
FIG. 7B is a diagram showing a mounting operation between the slide rail mounting mechanism and the carried object for correspondingly mounting all mounting elements of the carried object in the receiving slots of the rail element according to an embodiment of the present invention.

As shown in FIG. 7A and FIG. 7B, the first receiving slot 22 and the second receiving slot 24 of the rail element 10 are respectively configured to mount the first mounting element 202 and the second mounting element 204 of the carried object 200.

When the carried object 200 is going to be mounted to the rail element 10, the adjustment element 12 can be adjusted in advance by the user to move relative to the rail element 10 to the second position P2, in order to allow the blocking part 40 of the adjustment element 12 to extend to be in the first receiving slot 22 between the first part 28a and the second part 28b, to occupy part of space in the first receiving slot 22. Meanwhile, the first receiving slot 22 is changed to a substantially L shaped or J shaped slot by the blocking part 40. When mounting the carried object 200 to the rail element 10, the user can obliquely place the first mounting element 202 of the carried object 200 into the second part 28b of the first receiving slot 22 from the first part 28a of the first receiving slot 22. On the other hand, the second mounting element 204 of the carried object 200 can be accordingly dropped in the second receiving slot 24 for mounting. With assistance of the blocking part 40 of the adjustment element 12, the first mounting element 202 of the carried object 200 can be prevented from being directly detached from the first receiving slot 22 in a vertical manner. Particularly, the user also can respectively mount the first mounting element 202 and the second mounting element 204 of the carried object 200 to the first receiving slot 22 and the second receiving slot 24, and then adjust the adjustment element 12 to move from the first position P1 to the second position P2, in order to block the first mounting element 202 of the carried object 200 by the blocking part 40 of the adjustment element 12. Therefore, the position of the adjustment element 12 can be adjusted according to actual requirements of the user without limitation.

The slide rail mounting mechanism of the present invention is applicable to the carried objects with different lengths. Especially in a condition of not changing the structure of the rail element, the position of the adjustment element can be adjusted according to requirements to block the mounting element of the carried object to stay in the receiving slot of the rail element.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mounting mechanism, comprising:
   a rail element comprising a first receiving slot, a second receiving slot and a third receiving slot separated from each other, the first receiving slot located between the second receiving slot and the third receiving slot;
   an adjustment element movably mounted to the rail element and capable of moving relative to the rail element between a first position and a second position, one of the adjustment element and the rail element having an elongated hole; and
   a fixing element passing through the elongated hole for connecting the rail element and the adjustment element the fixing element being the only element positioning the adjustment element relative to the rail element;
   wherein when the adjustment element is located at the first position, the adjustment element does not extend to be in the first receiving slot;
   wherein when the adjustment element is adjusted to move from the first position to the second position, the adjustment element extends to part of space in the first receiving slot, and the adjustment element is non-movably fastened at the second position.

2. The slide rail mounting mechanism of claim 1, wherein the rail element has an upper wall, a lower wall and a middle wall connected between the upper wall and the lower wall, a passage is defined by the upper wall, the lower wall, and the middle wall, the adjustment element is located in the passage.

3. The slide rail mounting mechanism of claim 2, wherein the adjustment element has an upper part located adjacent to the upper wall of the rail element, a lower part located adjacent to the lower wall of the rail element, a main body part connected between the upper part and the lower part, and a blocking part extended from the main body part, the first receiving slot comprises a first part and a second part communicated with each other, when the adjustment element is located at the first position, the blocking part of the adjustment element does not extend to be in the first receiving slot between the first part and the second part, when the adjustment element is adjusted to move from the first position to the second position, the blocking part of the adjustment element extends to be in the first receiving slot between the first part and the second part.

4. The slide rail mounting mechanism of claim 1, wherein each of the first receiving slot, the second receiving slot and the third receiving slot is extended from a portion of the upper wall of the rail element to a portion of the middle wall of the rail element.

5. The slide rail mounting mechanism of claim 1, wherein the first receiving slot is substantially in a U shape.

6. The slide rail mounting mechanism of claim 1, wherein the second receiving slot is substantially in a J shape.

7. A slide rail mounting mechanism, comprising:
 a rail element having an upper wall, a lower wall and a middle wall connected between the upper wall and the lower wall, a first receiving slot, and a second receiving slot and a third receiving slot being formed between the upper wall and the middle wall, the first receiving slot located between the second receiving slot and the third receiving slot, wherein the first receiving slot comprises a first part and a second part communicated with each other;
 an adjustment element movably mounted to the rail element, the adjustment element having an upper part located adjacent to the upper wall of the rail element and a lower part located adjacent to the lower wall of the rail element; and
 a fixing element configured to connect the rail element and the adjustment element the fixing element being the only element positioning the adjustment element relative to the rail element;
 wherein when the adjustment element is adjusted to move to a position, the adjustment element extends to be in the first receiving slot between the first part and the second part, and the adjustment element is non-movably fastened at the position.

8. A slide rail mounting mechanism, applicable to a carried object, the carried object comprising a first mounting element and a second mounting element, the slide rail mounting mechanism comprising:
 a rail element comprising a first receiving slot, a second receiving slot and a third receiving slot separated from each other, the first receiving slot located between the second receiving slot and the third receiving slot, the first receiving slot being configured to mount the first mounting element and having a first part and a second part communicated with each other, the second receiving slot being configured to mount the second mounting element;
 an adjustment element movably mounted to the rail element, wherein when the adjustment element moves relative to the rail element to a position, the adjustment element extends to be in the first receiving slot between the first part and the second part; and
 a fixing element configured to connect the rail element and the adjustment element the fixing element being the only element positioning the adjustment element relative to the rail element;
 wherein when the first mounting element of the carried object enters the second part from the first part of the first receiving slot of the rail element and the second mounting element is located in the second receiving slot, the adjustment element, which is non-movably fastened at the position, is configured to block the first mounting element from being directly detached from the first receiving slot in a vertical manner.

* * * * *